United States Patent [19]
Gardner et al.

[11] Patent Number: 5,912,188
[45] Date of Patent: Jun. 15, 1999

[54] METHOD OF FORMING A CONTACT HOLE IN AN INTERLEVEL DIELECTRIC LAYER USING DUAL ETCH STOPS

[75] Inventors: Mark I. Gardner, Cedar Creek; Daniel Kadosh; Frederick N. Hause, both of Austin, all of Tex.

[73] Assignee: Advanced Micro Devices, Inc., Sunnyvale, Calif.

[21] Appl. No.: 08/905,686

[22] Filed: Aug. 4, 1997

[51] Int. Cl.$^6$ ................................................ H01L 21/00
[52] U.S. Cl. .................... 438/740; 438/637; 438/675; 438/733; 438/738
[58] Field of Search .................................... 438/576, 578, 438/586, 618, 630, 637, 638, 649, 675, 682, 692, 733, 738, 740, 743, 744

[56] References Cited

U.S. PATENT DOCUMENTS

| | | | |
|---|---|---|---|
| 4,717,449 | 1/1988 | Erie et al. | 437/195 |
| 4,943,539 | 7/1990 | Wilson et al. | 437/195 |
| 5,110,712 | 5/1992 | Kessler et al. | 430/312 |
| 5,162,260 | 11/1992 | Leibovitz et al. | 437/195 |
| 5,275,972 | 1/1994 | Ogawa et al. | 438/740 X |
| 5,451,543 | 9/1995 | Woo et al. | 437/195 |
| 5,472,825 | 12/1995 | Sayka | 430/311 |
| 5,612,254 | 3/1997 | Mu et al. | 437/195 |

OTHER PUBLICATIONS

Wolf, Stanley, Silicon Processing for the VLSI Era, vol. 2: Process Integration, Lattice Press, Sunset Beach, California, 1990, pp. 101–111; 189–199; 240–259; 276–283.

Higelin, G. et al., "Double Level Interconnection System For Submicron CMOS Applications," VLSI Multilevel Interconnection Conference, Jun. 13–14, 1988, pp. 29–34.

*Primary Examiner*—William Powell
*Attorney, Agent, or Firm*—Skjerven, Morrill, MacPherson, Franklin & Friel, L.L.P.

[57] ABSTRACT

A method of forming a contact hole in an interlevel dielectric layer using dual etch stops includes the steps of providing a semiconductor substrate, forming a gate over the substrate, forming a source/drain region in the substrate, providing a source/drain contact electrically coupled to the source/drain region, forming an interlevel dielectric layer that includes first, second and third dielectric layers over the source/drain contact, forming an etch mask over the interlevel dielectric layer, applying a first etch which is highly selective of the first dielectric layer with respect to the second dielectric layer through an opening in the etch mask using the second dielectric layer as an etch stop, thereby forming a first hole in the first dielectric layer that extends to the second dielectric layer without extending to the third dielectric layer, applying a second etch which is highly selective of the second dielectric layer with respect to the third dielectric layer through the opening in the etch mask using the third dielectric layer as an etch stop, thereby forming a second hole in the second dielectric layer that extends to the third dielectric layer without extending to the source/drain contact, and applying a third etch which is highly selective of the third dielectric layer with respect to the source/drain contact through the opening in the etch mask, thereby forming a third hole in the third dielectric layer that extends to the source/drain contact, wherein the first, second and third holes in combination provide the contact hole. In this manner, the contact hole is formed in the interlevel dielectric without any appreciable gouging of the underlying materials.

30 Claims, 4 Drawing Sheets

METHOD OF FORMING A CONTACT HOLE IN AN INTERLEVEL DIELECTRIC LAYER USING DUAL ETCH STOPS

BACKGROUND OF THE INVENTION

1. Field of the Invention

The present invention relates to integrated circuit manufacturing, and more particularly to forming a contact hole in an interlevel dielectric layer.

2. Description of Related Art

An insulated-gate field-effect transistor (IGFET), such as a metal-oxide semiconductor field-effect transistor (MOSFET), uses a gate to control an underlying surface channel joining a source and a drain. The channel, source and drain are located in a semiconductor substrate, with the source and drain being doped oppositely to the substrate. The gate is separated from the semiconductor substrate by a thin insulating layer such as a gate oxide. The operation of the IGFET involves application of an input voltage to the gate, which sets up a transverse electric field in the channel in order to modulate the longitudinal conductance of the channel.

Refractory metal silicides are frequently used to provide low resistance contacts for the gate, source and drain. With this approach, a thin layer of refractory metal is deposited over the structure, and heat is applied to form a silicide wherever the refractory metal is adjacent to silicon (including single crystal silicon and polysilicon). Thereafter, an etch is applied that removes unreacted refractory metal to prevent bridging, silicide contacts for the gate, source and drain.

The devices must be selectively interconnected to form circuit patterns. As one approach, a first interlevel dielectric is formed over the substrate, first contact holes (or vias) are etched in the first interlevel dielectric to expose the silicide contacts, first metal plugs are formed in the first contact holes, and a metal-1 pattern is formed over the first interlevel dielectric that selectively interconnects the first metal plugs. Thereafter, a second interlevel dielectric is formed over the metal-1 pattern, second contact holes are etched in the second interlevel dielectric to expose the metal-1 pattern, second metal plugs are formed in the second contact holes, and a metal-2 pattern is formed over the second interlevel dielectric that selectively interconnects the second metal plugs. Additional interlevel dielectrics and metal patterns (such as metal-3, metal-4 and metal-5) can be formed in a similar manner.

Forming contact holes in the first interlevel dielectric is a key step in the fabrication of multilevel interconnect structures. The minimum size of the contact holes is usually determined by the minimum resolution of the optical lithography tool. When contact holes are larger than about 2.0 microns, wet etching is often used. However, the isotropic nature of wet chemical etching makes it generally unsuitable for patterning submicron contact holes. Since the first interlevel dielectric is typically silicon dioxide, dry etching for silicon dioxide is often used to form submicron contact holes.

Dry etching silicon dioxide typically involves a plasma etching procedure in which a plasma generates reactive gas species that chemically etch the material in direct proximity to the plasma. The ability to achieve anisotropic etching requires bombardment of the silicon dioxide with energetic ions. Other parameters such as the chemical nature of the plasma also influence the degree of anisotropy. In general, the etch is highly anisotropic and forms contact holes with straight vertical sidewalls that taper slightly. The etch rate depends on several factors including pressure, power, feed gas composition, and film characteristics. For instance, thermally grown silicon dioxide etches more slowly than chemical vapor deposited silicon dioxide. In addition, the etch can be highly selective of silicon dioxide with respect to underlying silicon.

Dry etch equipment requires the availability of effective end-point detection tools for reducing the degree of overetching, increasing throughput and achieving run-to-run reproducibility. Four common methods for determining the end-point of dry etch processes are 1) laser interferometry and reflectivity, 2) optical emission spectroscopy, 3) direct observation through a viewing port on the chamber by a human operator, and 4) mass spectroscopy. End-point detection of contact holes can be difficult because the total area being etched is quite small compared to other layers.

Furthermore, in many integrated circuits, individual devices in various areas are arranged in different configurations and densities. For example, some integrated circuits include devices having a wide range of functionality with the variability of functionality being reflected in a variability of layout configuration. One implication arising from the variability of configuration is that some areas of the integrated circuit are densely populated with devices while other areas include only relatively isolated devices.

Applicant has observed that when silicon dioxide is dry etched, the etch rate of contact holes is often slower in densely populated areas of the substrate (with a high density of contact holes) than in sparsely populated areas of the substrate (with a low density of contact holes). The difference in etch rates may result from poorly-understood aspects of the chemistry of the plasma etching, such as increasing the rate of reactive ion etching in areas having a low density of contact holes and therefore less of the silicon dioxide layer exposed to the etch. Irrespective of the causes, since etched silicon beneath certain contact holes may be detected before other contact holes are completely etched, an overetch becomes necessary to ensure complete formation of all the contact holes. Unfortunately, the overetching can cause appreciable gouging of the underlying materials beneath the contact holes. For instance, the overetching can damage the silicon surface of source/drain regions, damage or remove thin silicide contacts, remove substantial portions of oxide spacers adjacent to the gate, and/or remove substantial portions of field oxides such as trench oxides or LOCOS in the substrate. The gouging increases the potential for excessive leakage current as well as device failure.

One solution known in the art is to form an interlevel dielectric layer with a thick silicon dioxide layer on a thin silicon nitride layer. A first etch is applied which is highly selective of silicon dioxide with respect to silicon nitride to form holes in the silicon dioxide layer using the silicon nitride layer as an etch stop. This allows the first etch to have a sufficiently long duration without damaging the underlying materials. Thereafter, a second etch is briefly applied which is highly selective of silicon nitride to complete formation of the contact hole. A drawback to this approach, however, is that the second etch is usually highly selective of silicon as well. As a result, substantial damage to an underlying silicon surface may arise.

Accordingly, a need exists for a method of forming a contact hole in an interlevel dielectric without appreciably gouging the underlying materials.

SUMMARY OF THE INVENTION

An object of the invention is to provide a contact hole in an interlevel dielectric without any appreciable gouging of the underlying materials. Generally speaking, this is accomplished by forming an interlevel dielectric with first, second and third dielectric layers, etching a first hole in the first dielectric layer using the second dielectric layer as an etch stop, etching a second hole in the second dielectric layer using the third dielectric layer as an etch stop, and etching a third hole in the third dielectric layer.

In accordance with one aspect of the invention, a method of forming a contact hole in an interlevel dielectric layer using dual etch stops includes the steps of providing a semiconductor substrate, forming a gate over the substrate, forming a source/drain region in the substrate, providing a source/drain contact electrically coupled to the source/drain region, forming an interlevel dielectric layer that includes first, second and third dielectric layers over the source/drain contact, forming an etch mask over the interlevel dielectric layer, applying a first etch which is highly selective of the first dielectric layer with respect to the second dielectric layer through an opening in the etch mask using the second dielectric layer as an etch stop, thereby forming a first hole in the first dielectric layer that extends to the second dielectric layer without extending to the third dielectric layer, applying a second etch which is highly selective of the second dielectric layer with respect to the third dielectric layer through the opening in the etch mask using the third dielectric layer as an etch stop, thereby forming a second hole in the second dielectric layer that extends to the third dielectric layer without extending to the source/drain contact, and applying a third etch which is highly selective of the third dielectric layer with respect to the source/drain contact through the opening in the etch mask, thereby forming a third hole in the third dielectric layer that extends to the source/drain contact, wherein the first, second and third holes in combination provide the contact hole.

Preferably, the first, second and third etches are anisotropic etches that form the contact hole with straight sidewalls, and the interlevel dielectric layer is planarized by chemical-mechanical polishing before forming the etch mask. It is also preferred that the gate have a greater thickness than a combined thickness of the second and third dielectric layers, and that the first dielectric layer have a greater thickness than the gate.

As exemplary materials, the gate is polysilicon, the etch mask is photoresist, the first and third dielectric layers are silicon dioxide or silicon oxyfluoride, and the second dielectric layer is silicon nitride, silicon oxynitride, hydrogen silsesquioxane, fluorinated polyimide, poly-phenylquinoxaline, polyquinoline, or methysilsesquixane polymer.

Advantageously, the first etch can have a long duration to ensure that the first hole is completely etched through a thick first dielectric layer without etching the third dielectric layer, the second etch can be highly selective of the source/drain contact without etching the source/drain contact, and the third etch can have a brief duration and can be unselective of the source/drain contact to ensure that the third hole is completely etched through a thin third dielectric layer without any appreciable gouging to the source/drain contact. Moreover, even if the third etch is highly selective of other materials (such as oxide spacers or field oxide) beneath the contact hole, the brief duration of the third etch prevents any appreciable gouging to these materials as well.

Thereafter, a conductive plug can be formed in the contact hole, and a metal-1 pattern can be formed on the first dielectric layer that contacts the conductive plug. If desired, the conductive plug can provide a local interconnect to a second source/drain contact exposed by the contact hole.

The source/drain contact can be a silicide contact formed on the source/drain region, or alternatively the source/drain contact can be the source/drain region itself.

These and other objects, features and advantages of the invention will be further described and more readily apparent from a review of the detailed description of the preferred embodiments which follows.

BRIEF DESCRIPTION OF THE DRAWINGS

The following detailed description of the preferred embodiments can best be understood when read in conjunction with the following drawings, in which.

DETAILED DESCRIPTION OF THE PREFERRED EMBODIMENTS

Figure 1A:
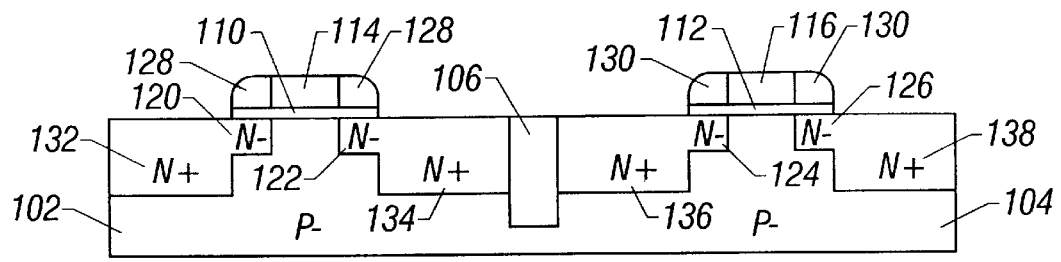
FIGS. 1A–1J show cross-sectional views of successive process steps for forming a contact hole in an interlevel dielectric layer in accordance with an embodiment of the invention.

In the drawings, depicted elements are not necessarily drawn to scale and like or similar elements may be designated by the same reference numeral throughout the several views.

In FIG. 1A, a silicon substrate suitable for integrated circuit manufacture is provided. The substrate includes a P− type epitaxial surface layer on a P+ base layer (not shown). The epitaxial surface layer has a boron background concentration on the order of $1 \times 10^{15}$ atoms/cm$^3$, a <100> orientation and a resistivity of 12 ohm-cm. Active regions 102 and 104 of the substrate are shown. Trench oxide 106 composed of silicon dioxide (SiO$_2$) is formed in the substrate and provides dielectric isolation between active regions 102 and 104. Active regions 102 and 104 are subjected to a well implant, a punchthrough implant, and a threshold adjust implant. The well implant provides a more uniform background doping, the punchthrough implant provides greater robustness to punchthrough voltages, and the threshold voltage implant shifts the threshold voltage to a desired value such as 0.4 to 0.7 volts. Gate oxides 110 and 112 composed of silicon dioxide are formed on the top surface of active regions 102 and 104, respectively, using tube growth at a temperature of 700 to 1000° C. in an O$_2$ containing ambient. Thereafter, a polysilicon layer with a thickness of 2000 angstroms is deposited over the structure by chemical vapor deposition and patterned using photolithography and an etch step to form polysilicon gates 114 and 116 on gate oxides 110 and 112, respectively. Polysilicon gates 114 and 116 each have a length of 3500 angstroms between opposing sidewalls.

Lightly doped source and drain regions 120 and 122 are implanted into active region 102 and lightly doped source and drain regions 124 and 126 are implanted into active region 104 by subjecting the structure to ion implantation of phosphorus, at a dose of $1 \times 10^{13}$ to $5 \times 10^{14}$ atoms/cm$^2$ and an energy of 2 to 35 kiloelectron-volts, using polysilicon gate 114 as an implant mask for active region 102 and using polysilicon gate 116 as an implant mask for active region 104. Lightly doped source and drain regions 120, 122, 124 and 126 are doped N− with a phosphorus concentration of $1 \times 10^{17}$ to $1 \times 10^{18}$ atoms/cm$^3$ and form channel junctions substantially aligned with the opposing sidewalls of polysilicon gates 114 and 116. Thereafter, an oxide layer with a thickness of 1500 angstroms is conformally deposited over the exposed surfaces by plasma enhanced chemical vapor deposition at a temperature of 300 to 450° C., and an anisotropic reactive ion etch is applied that is highly selective of silicon dioxide with respect to silicon to form oxide spacers 128 and 130 adjacent to the opposing sidewalls of polysilicon gates 114 and 116, respectively. The anisotropic etch also removes portions of the gate oxides outside polysilicon gates 114 and 116 and oxide spacers 128 and 130. Next, heavily doped source and drain regions 132 and 134 are implanted into active region 102 and heavily doped source and drain regions 136 and 138 are implanted into active region 104 by subjecting the structure to ion implantation of arsenic, at a dose of $1 \times 10^{15}$ to $5 \times 10^{15}$ atoms/cm$^2$ and an energy of 10 to 80 kiloelectron-volts, using polysilicon gate 114 and oxide spacers 128 as an implant mask for active region 102 and using polysilicon gate 116 and oxide spacers 130 as an implant mask for active region 104. Heavily doped source and drain regions 132, 134, 136 and 138 are doped N+ with an arsenic concentration of $1 \times 10^{18}$ to $1 \times 10^{20}$ atoms/cm$^3$. The device is then annealed to remove crystalline damage and to drive-in and activate the implanted dopants by applying a rapid thermal anneal on the order of 950 to 1050° C. for 10 to 30 seconds. As a result, a first N-channel IGFET is formed with a source (consisting of source regions 120 and 132) and a drain (consisting of drain regions 122 and 134) controlled by polysilicon gate 114, and a second N-channel IGFET is formed with a source (consisting of source regions 124 and 136) and a drain (consisting of drain regions 126 and 138) controlled by polysilicon gate 116.

Figure 1B:
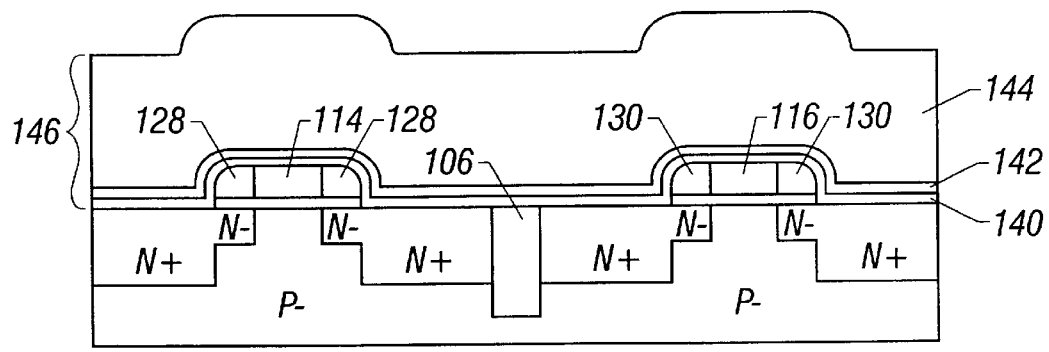

In FIG. 1B, oxide layer 140 with a thickness of 50 to 200 angstroms is conformally deposited over the exposed surfaces by plasma enhanced chemical vapor deposition at a temperature of 300 to 450° C. Oxide layer 140 contacts trench oxide 106, polysilicon gates 114 and 116, oxide spacers 128 and 130, and heavily doped source and drain regions 132, 134, 136 and 138. Thereafter, nitride layer 142 composed of silicon nitride (Si$_3$N$_4$) with a thickness of 100 to 300 angstroms is conformally deposited on oxide layer 140 by plasma enhanced chemical vapor deposition at a temperature of 300 to 800° C. Nitride layer 142 does not contact any material beneath oxide layer 140. Thereafter, oxide layer 144 with a thickness of 12,000 to 15,000 angstroms is conformally deposited on nitride layer 142 by plasma enhanced chemical vapor deposition at a temperature of 300 to 450° C. Oxide layer 144 does not contact any material beneath nitride layer 142. As is seen, the top surfaces of oxide layer 140, nitride layer 142 and oxide layer 144 are substantially non-planar and reflect the topography of polysilicon gates 114 and 116 and oxide spacers 128 and 130. The combination of oxide layer 140, nitride layer 142 and oxide layer 144 forms an interlevel dielectric layer 146 between polysilicon gates 114 and 116 and a metal-1 pattern to be subsequently formed.

Figure 1C:
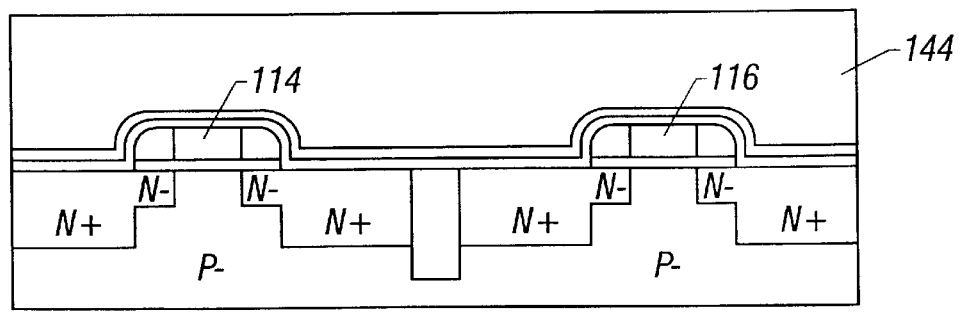

In FIG. 1C, oxide layer 144 is planarized by applying chemical-mechanical polishing. As a result, oxide layer 144 has a planar top surface about 10,000 angstroms above polysilicon gates 114 and 116.

Figure 1D:
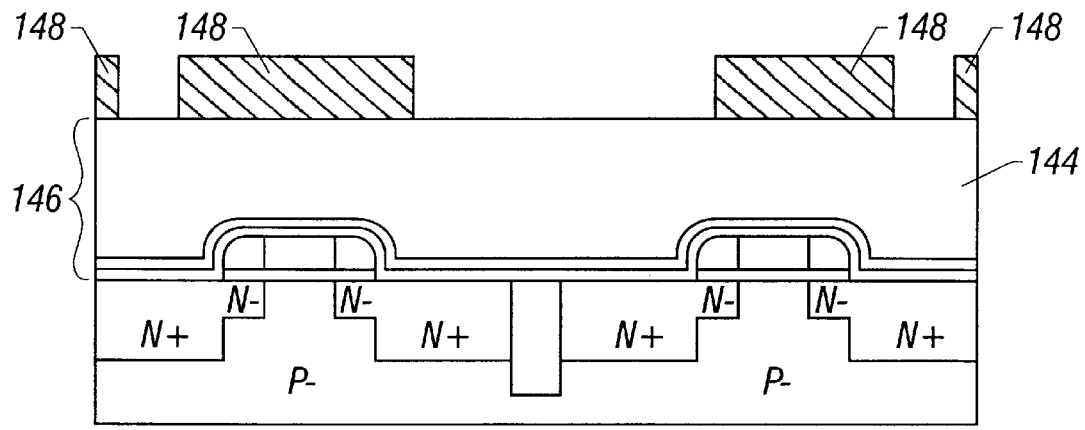

In FIG. 1D, photoresist layer 148 is deposited on oxide layer 144. A photolithographic system, such as a step and repeat optical projection system which generates deep ultraviolet light from a mercury-vapor lamp, uses a reticle to irradiate photoresist layer 148 with an image pattern.

Thereafter, the irradiated portions of photoresist layer 148 are removed, and photoresist layer 148 includes openings that define contact holes to be subsequently formed in interlevel dielectric layer 146.

Figure 1E:
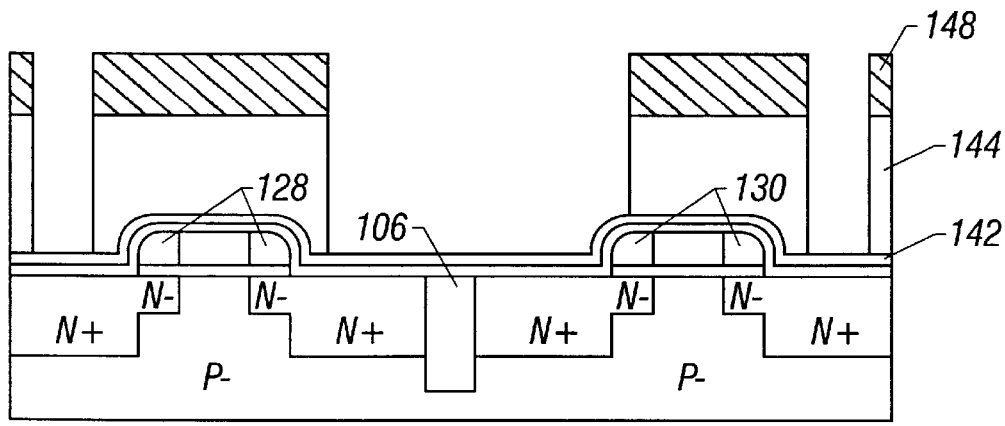

In FIG. 1E, a long anisotropic reactive ion etch is applied that is highly selective of silicon dioxide with respect to silicon nitride using photoresist layer 148 as an etch mask and using nitride layer 142 as an etch stop. The etch forms holes in oxide layer 144 that extend to nitride layer 142. The etch removes only a negligible amount of nitride layer 142, and the materials beneath nitride layer 142 are protected and unaffected. Nitride layer 142 allows a long overetch to assure that the holes are completely formed in all regions of oxide layer 144 beneath the openings in photoresist layer 148. Although the etch is highly selective of trench oxide 106 and oxide spacers 128 and 130, nitride layer 142 prevents the etch from reaching these regions.

Figure 1F:
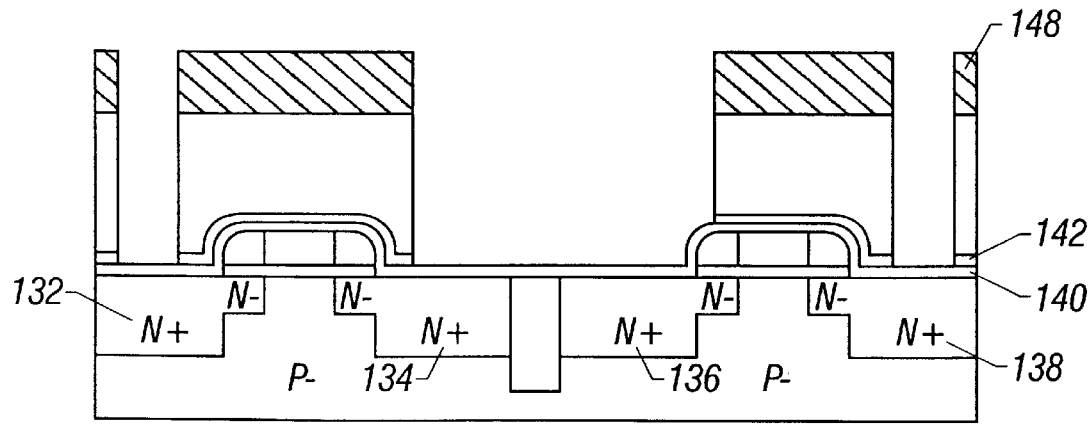

In FIG. 1F, the etch chemistry is changed and a brief anisotropic reactive ion etch is applied that is highly selective of silicon nitride with respect to silicon dioxide using photoresist layer 148 as an etch mask and using oxide layer 140 as an etch stop. The etch forms holes in nitride layer 142 that extend to oxide layer 140. The etch removes only a negligible amount of oxide layer 140, and the materials beneath oxide layer 140 are protected and unaffected. Although the etch is highly selective of heavily doped source and drain regions 132, 134, 136 and 138, oxide layer 140 prevents the etch from reaching these regions.

Figure 1G:
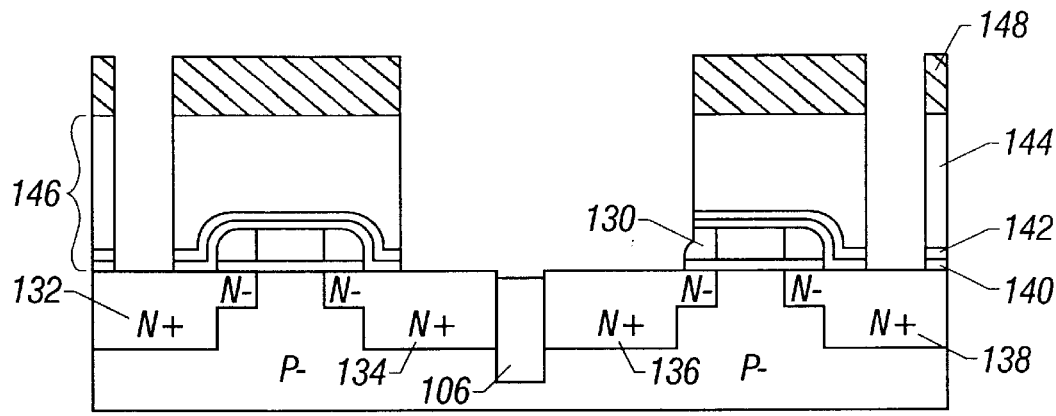

In FIG. 1G, the etch chemistry is changed again and a brief anisotropic reactive ion etch is applied that is highly selective of silicon dioxide with respect to silicon nitride using photoresist layer 148 as an etch mask. The etch forms holes in oxide layer 140 that extend to trench oxide 106, heavily doped source and drain regions 132, 134, 136 and 138, and the left-side oxide spacer 130. Trench oxide 106 and heavily doped source and drain regions 132, 134, 136 and 138 are intended to be exposed, however the left-side oxide spacer 130 is exposed due to misalignment of the overlying opening in photoresist layer 148. Advantageously, the etch is brief and non-selective of silicon, and therefore removes only a negligible amount of heavily doped source and drain regions 132, 134, 136 and 138. Moreover, although the etch is highly selective of silicon dioxide, since the etch is brief it removes only slight amounts of trench oxide 106 and the exposed oxide spacer 130. The holes in oxide layer 140, nitride layer 142 and oxide layer 144 in combination provide contact holes in interlevel dielectric layer 146. The contact holes have straight sidewalls that are substantially vertical. Of importance, the contact holes are formed without any appreciable gouging to the materials beneath oxide layer 140.

Figure 1H:
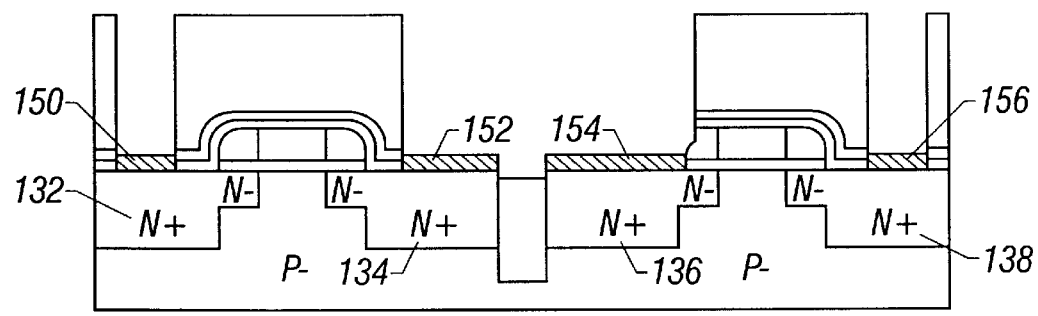

In FIG. 1H, photoresist layer 148 is stripped, a titanium layer with a thickness of 100 to 350 angstroms is deposited on the exposed surfaces, a rapid thermal anneal on the order of 700° C. for 30 seconds is applied in a nitrogen ambient to form titanium silicide contacts 150, 152, 154, and 156 on heavily doped source and drain regions 132, 134, 136 and 138, respectively, the unreacted titanium (including titanium nitride) on the silicon dioxide and silicon nitride is stripped, and a rapid thermal anneal on the order of 750 to 800° C. for 30 seconds is applied to lower the resistivity of the titanium silicide contacts.

Figure 1I:
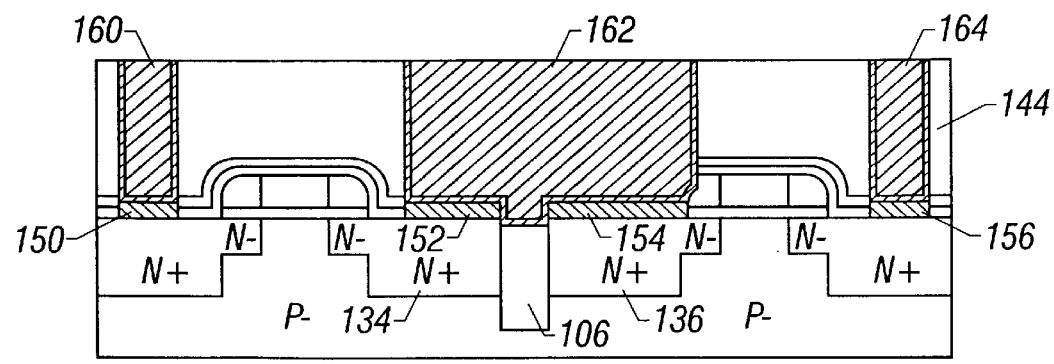

In FIG. 1I, a thin titanium layer and then a thin titanium nitride layer are sputter deposited over the structure to form an adhesion liner that covers the top surface of oxide layer 144, the sidewalls of the contact holes, titanium silicide contacts 150, 152, 154 and 156 and trench oxide 106, a thick tungsten layer is sputter deposited on the adhesion liner and fills the remaining space in the contact holes, and structure is planarized by applying chemical-mechanical polishing to remove the adhesion liner and tungsten above the contact holes. As a result, conductive plugs 160, 162 and 164 are formed in the contact holes and are aligned with the top surface of oxide layer 144. Conductive plugs 160, 162 and 164 each include the adhesion liner (shown as a single layer) and the tungsten. In addition, conductive plug 160 includes titanium silicide contact 150, conductive plug 160 includes titanium silicide contacts 152 and 154, and conductive plug 164 includes titanium silicide contact 156. Conductive plugs 160 and 164 have diameters of 3500 to 4500 angstroms. Conductive plug 162 is considerably larger and provides a local interconnect between heavily doped drain region 134 and heavily doped source region 136.

Figure 1J:
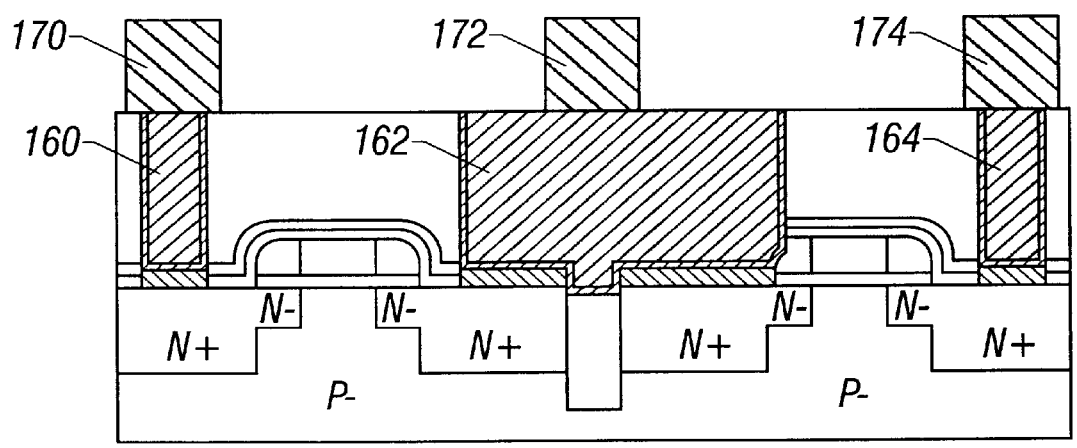

In FIG. 1J, an aluminum layer with a thickness of 6000 angstroms is sputter deposited over the structure and patterned using photolithography and an etch step to form a metal-1 pattern that includes aluminum lines 170, 172 and 174 in contact with conductive plugs 160, 162 and 164, respectively. Aluminum lines 170, 172 and 174 have linewidths of 4000 to 6000 angstroms.

Accordingly, a multilevel structure is formed first and second N-channel IGFETs, a metal-1 pattern, and an interlevel dielectric layer therebetween. Conductive plugs in the contact holes interconnect the metal-1 pattern to source/drain regions of the IGFETs. Advantageously, there is no appreciable gouging of the materials beneath the contact holes.

The present invention includes numerous variations to the embodiment described above. For instance, the interlevel dielectric layer can include first (upper), second (intermediate) and third (lower) dielectric layers of various materials as long as the first etch is highly selective of the first dielectric layer with respect to the second dielectric layer (such that the etch rate of the first dielectric layer is far greater than the etch rate of the second dielectric layer), and the second etch is highly selective of the second dielectric layer with respect to the third dielectric layer (such that the etch rate of the second dielectric layer is far greater than the etch rate of the third dielectric layer). Preferably, the third etch is highly selective of the third dielectric layer with respect to the source/drain contact (such that the etch rate of the third dielectric layer is far greater than the etch rate of the source/drain contact). For instance, when the first and third dielectric layers are silicon dioxide or silicon oxyfluoride, suitable materials for the second dielectric layer include silicon nitride, silicon oxynitride, hydrogen silsesquioxane, fluorinated polyimide, poly-phenylquinoxaline, polyquinoline, and methysilsesquixane polymer. Various conductors and dielectrics can be used for the gate and gate insulator, respectively. Similarly, the conductive plug and metal-1 pattern can include various metals and related compounds. For instance, the conductive plug can include tungsten, tantalum, titanium, titanium nitride, molybdenum, polysilicon, or a silicide, and the metal-1 pattern can include aluminum, aluminum alloys, copper, gold, silver, tungsten or molybdenum.

The source/drain regions of the substrate can provide source/drain contacts for the conductive plugs, as described above. Alternatively, silicide contacts can be formed on the source/drain regions before forming the interlevel dielectric layer, in which case the silicide contacts provide the source/drain contacts. In either case, the source/drain contacts are electrically coupled to the source/drain regions, are subjected to the third etch, are exposed by the contact holes, and are adjacent to the conductive plugs formed in the contact holes. Note, when used in this context, "source/drain regions" include source regions and drain regions. Therefore, a source/drain region can be a source region or a drain region, and a source/drain contact can be a source contact or a drain contact.

Preferably, the gate has a greater thickness than a combined thickness of the second and third dielectric layers, and that the first dielectric layer has a greater thickness than the gate. More preferably, the first dielectric layer accounts for at least 95 percent of the thickness of the interlevel dielectric layer. The precise thickness of the second and third dielectric layers will depend on the etch selectivities and the desired safety margins. Preferably, the etch selectivities of the highly selective etches are at least 10:1. It is desirable to have a thin second dielectric layer so that a brief second etch can be used, and to have a thin third dielectric layer so that a brief third etch can be used. It is especially desirable to have a thin second dielectric layer if it has a higher dielectric constant than the first dielectric layer, since reducing the dielectric constant of the interlevel dielectric layer reduces interlevel capacitance and increases switching speeds. For instance, silicon dioxide has a dielectric constant of 3.9 and silicon nitride has a dielectric constant of 7.5, therefore a silicon nitride layer sandwiched between silicon dioxide layers should be as thin as possible.

The first, second and third etches are preferably anisotropic etches so that the contact holes have straight sidewalls that do not undercut the etch mask. However, when the second and third dielectric layers are thin, the second and third etches can be brief wet chemical etches that cause little or no undercutting.

As can be appreciated, the misalignment of the photoresist layer in the embodiment described above is not necessary or even desirable, but illustrates that such misalignment results in only slight damage to the exposed oxide spacer. Therefore, alignment tolerances may be relaxed to yield a more forgiving and less expensive process without unduly increasing the potential for device failure.

The invention is particularly well-suited for contact holes over N-channel MOSFETs, P-channel MOSFETs and other types of IGFETs, particularly for high-performance microprocessors where high circuit density is essential. Although a single pair of N-channel devices with an overlying interlevel dielectric layer and metal-1 pattern have been shown for purposes of illustration, it is understood that in actual practice, many devices are fabricated on a single semiconductor wafer as widely practiced in the art. Accordingly, the invention is well-suited for use in an integrated circuit chip, as well as an electronic system including a microprocessor, a memory and a system bus.

Those skilled in the art will readily implement the steps necessary to provide the structures and methods disclosed herein, and will understand that the process parameters, materials, and dimensions are given by way of example only and can be varied to achieve the desired structure as well as modifications which are within the scope of the invention. Variations and modifications of the embodiments disclosed herein may be made based on the description set forth herein, without departing from the scope and spirit of the invention as set forth in the following claims.

What is claimed is:

1. A method of forming a contact hole in an interlevel dielectric layer using dual etch stops, comprising:

providing a semiconductor substrate;

forming a gate over the substrate, forming a source/drain region in the substrate;

providing a source/drain contact electrically coupled to the source/drain region;

forming an interlevel dielectric layer that includes first, second and third dielectric layers over the source/drain contact;

forming an etch mask over the interlevel dielectric layer;

applying a first etch which is highly selective of the first dielectric layer with respect to the second dielectric layer through an opening in the etch mask using the second dielectric layer as an etch stop, thereby forming a first hole in the first dielectric layer that extends to the second dielectric layer without extending to the third dielectric layer;

applying a second etch which is highly selective of the second dielectric layer with respect to the third dielectric layer through the opening in the etch mask using the third dielectric layer as an etch stop, thereby forming a second hole in the second dielectric layer that extends to the third dielectric layer without extending to the source/drain contact; and applying a third etch which is highly selective of the third dielectric layer with respect to the source/drain contact through the opening in the etch mask, thereby forming a third hole in the third dielectric layer that extends to the source/drain contact, wherein the first, second and third holes in combination provide a contact hole in the interlevel dielectric layer.

2. The method of claim 1, wherein the gate has a greater thickness than a combined thickness of the second and third dielectric layers.

3. The method of claim 1, wherein the first, second and third etches are anisotropic etches and the contact hole has straight sidewalls.

4. The method of claim 1, wherein the second etch is highly selective of the source/drain contact with respect to the third dielectric layer.

5. The method of claim 1, wherein the source/drain contact is the source/drain region.

6. The method of claim 1, wherein the source/drain contact is a silicide contact on the source/drain region.

7. The method of claim 1, wherein the first and third dielectric layers are selected from the group consisting of silicon dioxide and silicon oxyfluoride, and the second dielectric layer is selected from the group consisting of silicon nitride, silicon oxynitride, hydrogen silsesquioxane, fluorinated polyimide, poly-phenylquinoxaline, polyquinoline, and methysilsesquixane polymer.

8. The method of claim 1, wherein the gate is polysilicon and the etch mask is photoresist.

9. The method of claim 1, including manufacturing an integrated circuit chip that includes the interlevel dielectric layer.

10. The method of claim 1, including manufacturing an electronic system that includes a microprocessor, a memory and a system bus, and that further includes the interlevel dielectric layer.

11. A method of forming a contact hole in an interlevel dielectric layer using dual etch stops, comprising:

providing a semiconductor substrate;

forming a gate insulator over the substrate;

forming a gate on the gate insulator;

forming a source/drain region in the substrate;

providing a source/drain contact electrically coupled to the source/drain region;

forming an interlevel dielectric layer that includes first, second and third dielectric layers over the source/drain contact, including forming the first dielectric layer on the second dielectric layer and forming the second dielectric layer on the third dielectric layer, wherein the gate has a greater thickness than a combined thickness of the second and third dielectric layers;

forming an etch mask over the interlevel dielectric layer;

applying a first anisotropic etch which is highly selective of the first dielectric layer with respect to the second dielectric layer through an opening in the etch mask using the second dielectric layer as an etch stop, thereby forming a first hole in the first dielectric layer that extends to the second dielectric layer without extending to the third dielectric layer;

applying a second anisotropic etch which is highly selective of the second dielectric layer with respect to the third dielectric layer through the opening in the etch mask using the third dielectric layer as an etch stop, thereby forming a second hole in the second dielectric layer that extends to the third dielectric layer without extending to the source/drain contact; and applying a third anisotropic etch which is highly selective of the third dielectric layer with respect to the source/drain contact through the opening in the etch mask, thereby forming a third hole in the third dielectric layer that extends to the source/drain contact, wherein the first, second and third holes in combination provide a contact hole in the interlevel dielectric layer.

12. The method of claim 11, wherein the second anisotropic etch is highly selective of the source/drain contact with respect to the third dielectric layer.

13. The method of claim 11, wherein the source/drain contact is the source/drain region.

14. The method of claim 11, wherein the source/drain contact is a silicide contact on the source/drain region.

15. The method of claim 11, wherein the interlevel dielectric layer consists of the first, second and third dielectric layers.

16. The method of claim 11, wherein the first and third dielectric layers are the same material.

17. The method of claim 16, wherein the first and third dielectric layers are selected from the group consisting of silicon dioxide and silicon oxyfluoride, and the second dielectric layer is selected from the group consisting of silicon nitride, silicon oxynitride, hydrogen silsesquioxane, fluorinated polyimide, poly-phenylquinoxaline, polyquinoline, and methysilsesquixane polymer.

18. The method of claim 11, wherein the gate is polysilicon and the etch mask is photoresist.

19. The method of claim 11, including forming a conductive plug in the contact hole that contacts the source/drain contact.

20. The method of claim 19, including forming a metal-1 pattern on the first dielectric layer that contacts the conductive plug.

21. A method of forming a contact hole in an interlevel dielectric layer using dual etch stops, comprising the sequence set forth:

providing a semiconductor substrate;

forming a gate oxide over the substrate;

forming a polysilicon gate on the gate oxide;

forming a source/drain region in the substrate and providing a source/drain contact electrically coupled to the source/drain region, wherein a distance between a top surface of the polysilicon gate and the substrate is greater than a distance between a top surface of the source/drain contact and the substrate;

forming an interlevel dielectric layer that consists of first, second and third dielectric layers over the source/drain contact, including forming the first dielectric layer on the second dielectric layer, forming the second dielectric layer on the third dielectric layer, and forming the third dielectric layer on the source/drain contact, wherein the first and third dielectric layers are the same material, the polysilicon gate has a greater thickness than a combined thickness of the second and third dielectric layers, and the first dielectric layer has a greater thickness than the polysilicon gate;

forming a photoresist layer on the interlevel dielectric layer;

applying a first anisotropic etch which is highly selective of the first dielectric layer with respect to the second dielectric layer through an opening in the photoresist layer using the photoresist layer as an etch mask and the second dielectric layer as an etch stop, thereby forming a first hole in the first dielectric layer that extends to the second dielectric layer without extending to the third dielectric layer;

applying a second anisotropic etch which is highly selective of the second dielectric layer with respect to the third dielectric layer through the opening in the photoresist layer using the photoresist layer as an etch mask and the third dielectric layer as an etch stop, thereby forming a second hole in the second dielectric layer that extends to the third dielectric layer without extending to the source/drain contact; and applying a third anisotropic etch which is highly selective of the third dielectric layer with respect to the source/drain contact through the opening in the photoresist layer using the photoresist layer as an etch mask, thereby forming a third hole through the third dielectric layer that extends to the source/drain contact, wherein the first, second and third holes in combination provide a contact hole with straight sidewalls in the interlevel dielectric layer.

22. The method of claim 21, wherein the second anisotropic etch is highly selective of the source/drain contact with respect to the third dielectric layer.

23. The method of claim 21, wherein the source/drain contact is the source/drain region.

24. The method of claim 21, wherein the source/drain contact is a silicide contact on the source/drain region.

25. The method of claim 21, wherein the first and third dielectric layers are the same material.

26. The method of claim 25, wherein the first and third dielectric layers are selected from the group consisting of silicon dioxide and silicon oxyfluoride.

27. The method of claim 26, wherein the second dielectric layer is selected from the group consisting of silicon nitride, silicon oxynitride, hydrogen silsesquioxane, fluorinated polyimide, polyphenylquinoxaline, polyquinoline, and methysilsesquixane polymer.

28. The method of claim 21, including planarizing the interlevel dielectric by applying chemical-mechanical polishing before forming the photoresist layer.

29. The method of claim 21, including the following steps in the sequence set forth:

stripping the photoresist layer after forming the contact hole;

forming a conductive plug in the contact hole that contacts the source/drain contact; and forming a metal-1 pattern on the first dielectric layer that contacts the conductive plug.

30. The method of claim 29, wherein:

the contact hole exposes the source/drain contact, a dielectric isolation region in the substrate, and a second source/drain contact electrically coupled to a second source/drain region in the substrate; and the conductive plug provides a local interconnect between the source/drain contact and the second source/drain contact.

* * * * *